INVENTOR
PAUL SCHNITZLER
BY
B. L. Zangwill
ATTORNEY

INVENTOR

PAUL SCHNITZLER

BY

B. L. Zangwill

ATTORNEY

INVENTOR
PAUL SCHNITZLER

BY

B. L. Zangwill
ATTORNEY

United States Patent Office 3,209,282
Patented Sept. 28, 1965

3,209,282
TUNNEL DIODE OSCILLATOR

Paul Schnitzler, New Brunswick, N.J., assignor, by mesne assignments, to the United States of America as represented by the Secretary of the Navy Filed May 16, 1962, Ser. No. 195,348
13 Claims. (Cl. 331—107)

This invention relates to oscillators, and more particularly relates to tunnel diode oscillators which have, in essence, only one mode of oscillation.

Tunnel diode oscillators have a tendency to oscillate at some lower frequency mode than their natural frequency of oscillation. This frequency mode is associated with the inductance of the leads. Accordingly, it is the principal object of the invention to provide a novel tunnel diode oscillator which will oscillate at substantially only one frequency mode.

A further object is to provide an oscillator in which the lead inductances are reduced to a minimum.

Another object is to provide a tunnel diode oscillator which has a stable operating point in the negative resistance region.

A further object is to provide a method of construction of tunnel diode oscillators that permits the use of lump circuit elements for operation as high as several kilomegacycles.

In accordance with this invention, a tunnel diode is connected in series with a capacitor, which has a larger value of capacitance than the equivalent capacitance of the tunnel diode. The tunnel diode oscillates with an inductor which is placed in parallel with the series combination of tunnel diode and capacitor. The power source is connected across the capacitor.

The inductor is a sheet of copper bent in the form of a U. A second sheet of copper is mounted between the legs of the U. The dielectric of the capacitor is mounted between one leg of the copper U and the second sheet of copper, and the tunnel diode is mounted between the second sheet of copper and the other leg of the U. Thus, one leg of the U and the second sheet of copper form the plates of the capacitor. The battery terminals are electrically connected to these plates.

In one embodiment of the invention the voltage source is a D.C. source. In this embodiment a resistor may be mounted in parallel with the capacitor and the source. This resistor may be placed between the second sheet of copper and one of the legs of the U. This circuit operates up to several kilomegacycles per second. A sufficiently small inductance may be achieved for these high frequencies by making the width and depth of the U sheet of copper small with respect to the dimension which is in a direction normal to the U.

In another embodiment of this invention the voltage source consists of a generator of short-width voltage pulses. Since the generator must have a low internal impedance in this embodiment, no resistance is placed in parallel with the voltage source and the capacitor.

The duration of the pulse from the pulse generator must be less than the duration of the output of the oscillator at the desired frequency. However, the duration of the triggering pulse and the generator must be long enough to permit the voltage across the capacitor to build up to the proper diode bias voltage. This pulse duration will be approximately equal to the ratio of the inductance of the pulse generator divided by the zero-bias resistance of the tunnel diode.

The principles of the invention together with additional objects and features thereof will be better understood by considering the following detailed description and the accompanying drawings in which.

Prior to a detailed consideration of the present invention a brief review will be made of certain principles of oscillators. Tunnel diode oscillators are of the class of oscillator called negative resistance oscillators. These oscillators each contain a circuit element having a current-voltage characteristic curve of negative slope within some range of operation, that is, having a negative dynamic resistance within this range. Negative resistance may be considered as capable of delivering power, in contrast to positive resistance, which absorbs power. Negative resistance oscillators must contain an element, the operation of which is characterized by negative resistance at times and positive resistance at other times. The operating curve of such an element is shown in FIG. 8.

Figure 8:
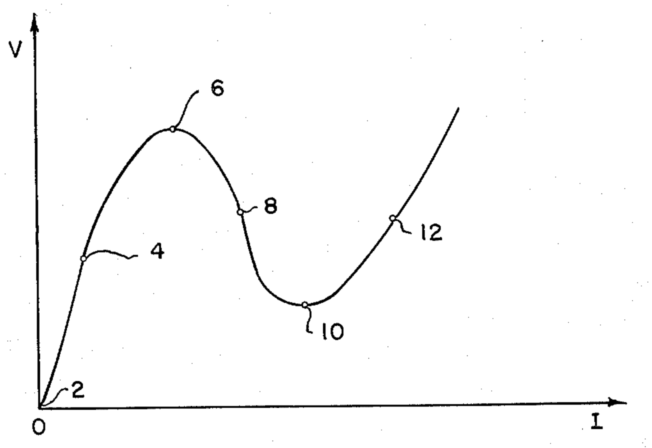
FIG. 8 is a voltage-current characteristic curve of an "N" type negative resistance device, in which curve the ordinate is voltages and the abscissa is currents.

In the characteristic curve of FIG. 8 point 2, is the origin at which there is no current and no voltage, 4 is a point in a region of positive resistance, 6 is a transition point, 8 is a point in a region of negative resistance, 10 is another transition point, and 12 is a point in a region of positive resistance. It can be seen that the device represented by this operating curve may operate alternately in a negative resistance region and in an adjacent positive resistance region. The element represented by this characteristic curve will operate as an alternating voltage source by first absorbing power from a D.C. source in its positive resistance region and then providing power by operating in its negative region.

On the operation of a device having a characteristic curve such as that of FIG. 8, sinusoidal oscillations can be obtained about points 6, 8, or 10. In operating about point 6 the energy absorbed in the positive resistance region between points 6 and 4 will be equal to the energy released in the negative resistance region between points 6 and 8. In operating in about point 8, the energy released when operating between points 8 and 6 will be equal to the energy absorbed between points 10 and 12; and the energy released when operating between the points 8 and 10 will be equal to the energy absorbed between the points 6 and 4. Thus, one half cycle of the oscillation will move between points 8 and 4 across transition point 6, and the other half cycle of the oscillation will move between points 8 and 12, across transistion point 10. When the element is operating about point 10 the energy released in the negative resistance region between 10 and 8 will be equal to the energy absorbed in the positive resistance region between 10 and 12.

The characteristic curve shown in FIG. 8, which was used to explain the operation of negative resistance oscillators is the most common type, called an "N" type negative resistance curve. This type of characteristic curve may be obtained by a tunnel diode used in conjunction with a transistor.

Figure 9:
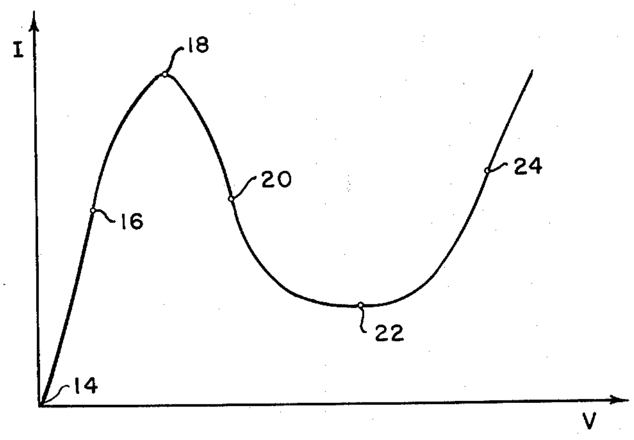
FIG. 9 is a voltage-current characteristic curve of a "S" type negative resistance device, in which curve the ordinate is current and the abscissa is voltages.

The preferred embodiment of the present invention involves the use of a tunnel diode alone, which will have the characteristic curve of the type shown in FIG. 9 commonly called an "S" type negative resistance curve. In the characteristic curve of FIG. 9, 14 represents the origin, 16 is a point in a region of positive resistance, 18 is a transition point, 20 is a point in a region of negative resistance, 22 is a transition point, and 24 is a point in a region of positive resistance. A device with a operating characteristic as shown in FIG. 9 may oscillate about point 20 in the negative resistance region as explained in conjunction with FIG. 8, taking point 8 as the operating point. Oscillation may also be obtained about point 18 or point 22. However, these points are not used since a slight shift of bias into the positive resistance region will cause a rapid decay of oscillation due to an absorbtion of more energy then is made available by the negative resistance region.

In the "N" type of negative resistance device as shown by the characteristic curve of FIG. 8, it is to be noted that in the horizontal area between peak voltage 6 and valley voltage 10, there are three possible values of current for each value of voltage. However, for a single specified value of current only one value of applied voltage will exist for that current. In the "S" type of negative resistance device as shown by the characteristic curve of FIG. 9, it is to be noted that in the horizontal area between peak current 18 and valley current 22, there are three possible values of voltage for each value of current. However, if the voltage is specified, only one value of current may be found for that voltage. It is seen, therefore, that these two type of devices are dualities as are capacitors and inductors.

The remainder of this description deals only with "S" type negative resistance devices as shown by the characteristic curve in FIG. 9 and which is obtainable in accordance with the invention with a tunnel diode without using a transistor therewith.

Figure 1:
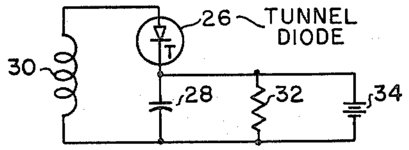
FIG. 1 is a schematic circuit diagram of an oscillator that is one embodiment of the invention.

A simple oscillator circuit utilizing the tunnel diode is shown in FIG. 1. A tunnel diode 26 is connected in series to capacitor 28; and inductance 30 is connected across the series combination of diode 26 and capacitor 28. A resistance 32 and a source of D.C. voltage 34 are connected in parallel with the capacitor 28. The tunnel-diode equivalent circuit may be assumed to be only a negative resistance 38 shunted by a capacitor 36 with the legend $C_e$.

Figure 2:
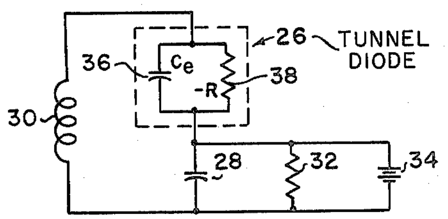
FIG. 2 is the equivalent circuit of the oscillator of FIG 1.

FIG. 2 is the equivalent circuit of the oscillator shown in FIG. 1. In it, the equivalent circuit for the diode 26 is shown as the capacitor 36 in parallel with the negative resistance 38. The capacitor 28 is large compared to the equivalent capacity 36 of the tunnel diode 26. The capacitor 28 is more than five times as large as the equivalent capacity 36 of the tunnel diode. Since the series combination of the capacitances 28 and 36 will be equal to the product of the two capacitances over their sum, it will be approximately equal to the smaller of the two capacitances in such case. Thus, the capacitor 36 will resonate with the inductor 30 in the equivalent circuit of FIG. 2.

A circuit using standard inductors and capacitors in the manner of FIG. 1, will operate reasonably up to 50 megacycles per second. In this region the required value for the inductance has become so small that wire cannot be used. At higher frequencies the oscillator is partially enclosed as shown in FIG. 3.

Figure 3:
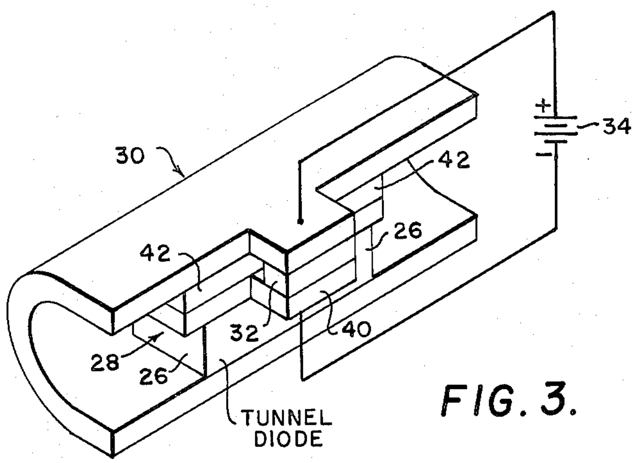
FIG. 3 is a diagrammatic perspective view, generally of the oscillator of FIG. 1.

FIG. 3 is a diagrammatic illustration of the oscillator of FIGS. 1 and 2, shown in perspective. The inductance 30 is a sheet of conducting material, such as for example copper, bent in the form of a U. Capacitor 28 is formed with one side of the U-shaped inductance as one plate and a second piece of copper 40 as the other leg. A dielectric material 42 is mounted between these two copper sheets. The tunnel diode 26 is mounted between the second sheet of copper 40 and the other leg of the U-shaped inductance 30. The resistor 32 is mounted between the two copper sheets in front of the dielectric, and the battery 34 is connected to the two sheets. This is best shown in the side view of FIG. 6.

Figure 4:
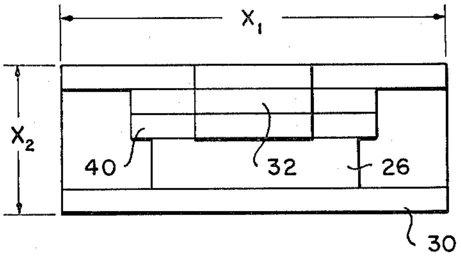
FIG. 4 is a front view of the oscillator of FIG. 3.
Figure 5:
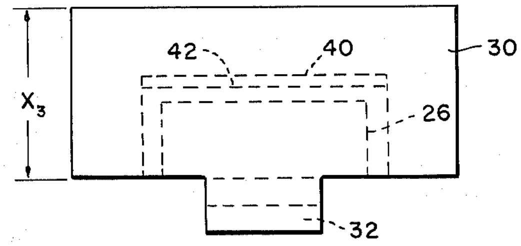
FIG. 5 is a top view of this oscillator.
Figure 6:
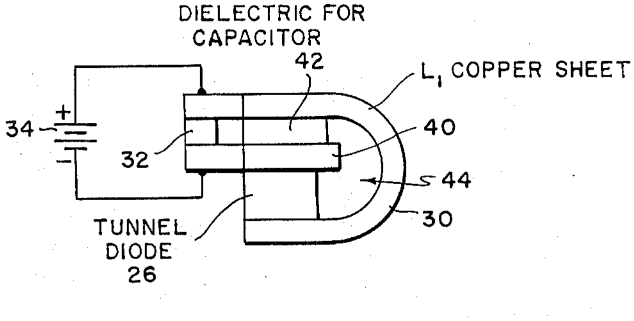
FIG. 6 is a side view of the oscillator.

The oscillator is shown in an elevational view, a plan view and a side view in FIGS. 4, 5 and 6, respectively. In these views the inductance is shown as number 30, the tunnel diode as 26, one side of the capacitor as 40, the dielectric of the capacitor as 42, the resistor as 32 and a source of D.C. voltage as 34.

The inductance $L_1$ of the copper sheet 30 can be made very small. As is well known that inductance depends on the geometry of the inductor, but is also proportional to the number of flux-linkages per unit current. Since the copper sheet forms substantially only one loop, the inductance will be equal to the lines of flux per unit current passing through the U. This will be proportional to the open area 44 shown in the side view of FIG. 6 between the legs of the U, divided by the length $X_1$ of the U times the permeability of free space. Since there is only one loop formed by the circuit of the oscillator containing the inductance 30, the ampere turns or magnetomotive force will be equal to the current flowing through this loop. This magnetomotive force per unit current multiplied by the area 44 in square meters, divided by the length $X_1$ in meters and multiplied by the permeability of free space which is $4\pi \times 10^{-7}$ will closely approximate the inductance of the copper sheet.

It can be seen that if the lengths $X_2$ and $X_3$ as shown in FIGS. 4 and 5 are made very small and the length is made very large, the inductance of the copper sheet will be very small and suitable for high frequency oscillators. For example, an oscillator, which would operate in the 400 megacycle range, may be constructed with $X_1$ equal to 0.98 inch, $X_2$ equal to 0.07 inch and $X_3=0.09$ inch. It should be noted that the lead inductance of the oscillator is reduced to a minimum by mounting the tunnel diode and the dielectric of the capacitor directly on the legs of the U inductance. The resistance 32 is chosen to be smaller than the negative resistance 38 of the tunnel diode. At high frequencies the capacitor 28 shunts out this resistance.

Figure 7:
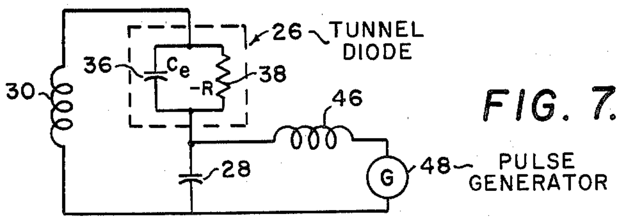
FIG. 7 is a schematic circuit diagram of the equivalent circuit of another embodiment of the invention.

The circuit of FIG. 7 may be pulsed. This embodiment is similar to that shown in FIG. 1 except that the resistor 32 is omitted. In FIG. 7, 46 represents the inductance $L_2$ of the pulse generator 48. The pulse generator 48 must have a low internal impedance. Also, the pulses from this generator must have a sufficient width to permit the voltage across diode 26 to build to the proper bias, and yet, they must be short enough so as to preclude oscillation between the capacitance 36 legend as $C_e$ of the diode and the internal inductance 46 of the pulse generator.

The time required to build up the proper bias voltage will be approximately equal to the inductance of the voltage source divided by the zero bias resistance R of the tunnel diode. To prevent oscillation between the inductance of the voltage source and shunting capacitor 28 which is in series with the tunnel diode, the pulse width must have a duration which is less than $2\pi$ times the square root of the product of the internal inductance and shunting capacitance, that is, $2\pi$ times the square root of the inductance 46 times the equivalent capacitance $C_1$ of both capacitor 28 and its parallel circuit in FIG. 7. This precludes oscillation at frequencies determined by the inductance and distributed capacitance associated with the partial enclosure.

Obviously many modifications and variations of the present invention are possible in light of the above teachings. It is therefore to be understood that within the scope of the appended claims the invention may be practiced otherwise than as specifically described.

What is claimed is:

1. An integrally formed high frequency lumped parameter oscillator, comprising:

(a) a semiconductor;

(b) a lumped parameter inductor comprising an elongated continuous metal member being formed into an open ended structure having a pair of flat walls extending from a closed end forming a partial enclosure, said semiconductor being mounted within said partial enclosure between said walls;

(c) a capacitor mounted within said partial enclosure between said walls; and (d) a source of voltage;

(e) said capacitor being connected in series with said semiconductor and having a value of capacitance larger than the equivalent capacitance of the semiconductor at a frequency, $$f=\frac{1}{2\pi\sqrt{LC}}$$

where L is the inductance of the lumped parameter inductance and C is the value of the equivalent capacitance of the semiconductor;

(f) said inductance being connected in parallel with the series combination of the semiconductor and capacitor, and said source of voltage being connected in parallel with said capacitor.

2. A high frequency lumped parameter oscillator according to claim 1, wherein said semiconductor is a tunnel diode.

3. A high frequency lumped parameter oscillator according to claim 2, wherein said tunnel diode has its anode connected to the inductance and its cathode connected to the capacitor.

4. A high frequency lumped parameter oscillator according to claim 1, in which the equivalent capacitance of said semiconductor is less than two tenths that of said capacitor.

5. A high frequency lumped parameter oscillator according to claim 1, in which a resistor is connected across said source of voltage and in parallel with said capacitor.

6. A high frequency lumped parameter oscillator according to claim 5, in which said source of voltage is a direct current source.

7. A high frequency lumped parameter oscillator according to claim 1, in which said source of voltage is a pulse generator with low internal impedance.

8. A high frequency lumped parameter oscillator according to claim 7, in which said pulse generator is of a type which generates pulses of a duration less than $2\pi\sqrt{LC}$ where C is the effective capacity of said capacitor and its parallel circuit and L is the equivalent inductance of said parallel source of voltage.

9. A high frequency lumped parameter oscillator according to claim 8, in which said pulse generator is of a type which generates pulses of a duration at least as long as $L/R$, where L is the series inductance of said voltage source and R is the zero bias resistance of the tunnel diode.

10. An oscillator, comprising:

(a) a first sheet of conducting material bent into a a U shape forming a partial enclosure having two parallel legs connected by a curved portion;

(b) a second sheet of conducting material positioned between the parallel legs of the U and spaced away from said first sheet of conducting material;

(c) a dielectric mounted between a first parallel leg of said U-shaped conducting material and said second sheet of conducting material;

(d) said dielectric material forming a capacitor with said first leg;

(e) a semiconductor mounted between and in electrical contact with the second parallel leg of said U-shaped conducting material and said second sheet of conducting material; and (f) a source of direct current voltage connected to said first leg of the U-shaped conducting material and said second sheet of conducting material.

11. An oscillator according to claim 10, wherein said semiconductor is a tunnel diode.

12. An oscillator according to claim 11, wherein the enclosure has a U shape cross section, the length of the legs of the U and the length of the curved portion is less than the length of the shunt in a direction perpendicular to the U shape cross section.

13. An oscillator according to claim 12, in which the equivalent capacitance of said semiconductor is less than that of said capacitor.

References Cited by the Examiner

UNITED STATES PATENTS

| | | | |
|---|---|---|---|
| 2,813,242 | 11/57 | Crump. | |
| 2,986,724 | 5/61 | Jaeger | 331—107 X |
| 3,089,126 | 5/63 | Miller | 307—88.5 X |
| 3,099,804 | 7/63 | Nelson | 331—107 |
| 3,127,574 | 3/64 | Sommers | 331—107 |
| 3,140,452 | 7/64 | Schmitz et al. | 331—107 X |

OTHER REFERENCES

Hines: "High-Frequency Negative-Resistance Circuit Principles for Esaki Diode Applications," The Bell System Technical Journal, May 1960, pages 477–513 (page 484 relied on).

Sarbacher: Encyclopedic Dictionary of Electronics and Nuclear Engineering, 1959, page 725 relied on.

"The Tunnel Diode Story," by Watters et al., in Radio Electronics, pages 26–29, July 1960.

ROY LAKE, *Primary Examiner.*

NATHAN KAUFMAN, *Examiner.*